(12) United States Patent
Rhodes et al.

(10) Patent No.: US 6,534,335 B1
(45) Date of Patent: Mar. 18, 2003

(54) OPTIMIZED LOW LEAKAGE DIODES, INCLUDING PHOTODIODES

(75) Inventors: Howard E. Rhodes, Boise, ID (US); Werner Juengling, Boise, ID (US); Thomas A. Figura, Nishiwaki (JP); Steven D. Cummings, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/358,543

(22) Filed: Jul. 22, 1999

(51) Int. Cl.[7] .............................................. H01L 21/00
(52) U.S. Cl. ..................... 438/60; 438/75; 438/144; 438/197; 438/199
(58) Field of Search ................... 438/57, 144, 163, 438/217, 194, 60, 61, 62, 75, 63, 227, 197, 199, 229, 301, 231, 232, 305, 306; 257/222, 223, 230, 233, 225, 228, 227, 439

(56) References Cited

U.S. PATENT DOCUMENTS

| | | | | |
|---|---|---|---|---|
| 4,280,271 A | * | 7/1981 | Lou et al. ...................... 29/571 |
| 4,663,645 A | * | 5/1987 | Komori et al. ............. 357/23.5 |
| 5,032,535 A | * | 7/1991 | Kamijo et al. ................ 437/44 |
| 5,352,620 A | * | 10/1994 | Komori et al. ............... 437/52 |
| 5,495,116 A | * | 2/1996 | Funakoshi et al. .......... 257/239 |
| 5,496,750 A | * | 3/1996 | Moslehi ........................ 437/41 |
| 5,861,655 A | * | 1/1999 | Kozuka et al. ............. 257/446 |
| 5,942,775 A | * | 8/1999 | Yiannoulos .................. 257/292 |
| 5,956,588 A | * | 9/1999 | Choi et al. ................... 438/286 |
| 6,143,612 A | * | 11/2000 | Derhacobain et al. ....... 438/289 |
| 6,150,676 A | * | 11/2000 | Sasaki ........................ 257/191 |
| 6,201,270 B1 | * | 3/2001 | Chen .......................... 257/292 |
| 6,128,691 A1 | * | 4/2001 | Chung et al. ................ 257/290 |
| 6,448,104 B1 | * | 9/2002 | Watanabe ..................... 438/60 |

FOREIGN PATENT DOCUMENTS

JP 4-315442 * 4/1992
JP 5-102403 * 4/1993

* cited by examiner

Primary Examiner—Long Pham
Assistant Examiner—Fernando Toledo
(74) Attorney, Agent, or Firm—Dickstein Shapiro Morin & Oshinsky LLP

(57) ABSTRACT

A photodiode for use in an imager having an improved charge leakage. The photodiode has a doped region that is spaced away from the field isolation to minimize charge leakage. A second embodiment of invention provides a second implant to improve charge leakage to the substrate. The photodiodes according to the invention provide improve charge leakage, improved reactions to dark current and an improved signal to noise ratio. Also disclosed are processes for forming the photodiode.

16 Claims, 5 Drawing Sheets

OPTIMIZED LOW LEAKAGE DIODES, INCLUDING PHOTODIODES

FIELD OF THE INVENTION

The invention relates generally to an improved diode for use in semiconductor devices The invention also relates generally to an improved photodiode having lower charge leakage to the substrate for use in imaging devices.

BACKGROUND OF THE INVENTION

Diodes find use in many solid-state devices. Diodes which respond to light, known as photodiodes, are widely used in many solid-state image sensors, also known as imagers, which were developed in the late 1960s and early 1970s primarily for video image acquisition, transmission, and display. An imager employing a photosensitive diode absorbs incident radiation of a particular wavelength (such as optical photons, x-rays, or the like) and generates an electrical signal corresponding to the absorbed radiation. Typical devices which use photosensitive diodes include charge coupled devices (CCDs), photodiode arrays, charge injection devices, hybrid focal plan arrays, memory and logic circuits and CMOS imagers.

In the case of photosensitive devices such as CCD's or CMOS imagers, the photosensitive region is typically a p-n junction. This junction is reverse biased by applying an electrical potential Vo which reverse biases the p-n junction. The p-n junction is then isolated typically by turning off a "reset transistor" that is used to reverse bias the junction. Under illumination, incident light photons create electron-hole pairs that are separated by the electric field in a depletion region of the p-n junction. This separation by the electric field results in one charge type being stored in the depletion region, thus collapsing the depletion region, and reducing the voltage Vo across the p-n junction. It is this reduction in voltage across the diode p-n junction due to light exposure that is measured.

To provide context for the invention, an exemplary prior art photodiode is described below with reference to FIG. 1. However, it is to be understood that the invention also has utility in any semiconductor diode device which includes a p-n junction where there is leakage to the substrate. Accordingly, the present invention may also find utility in semiconductor devices where p-n junctions are shielded from light, where p-n junctions are formed in a p-well, where p-n junctions are formed in an n-well, or more complicated junctions such, for example, a p-n-p junction. Also, while FIG. 1 shows a simplified photodiode 15 for use as a pixel of an imager, it should be understood that the single photodiode pixel 15 in practical use will be a part of either a row of pixels or an M×N array of pixels arranged in rows and columns.

Figure 1:
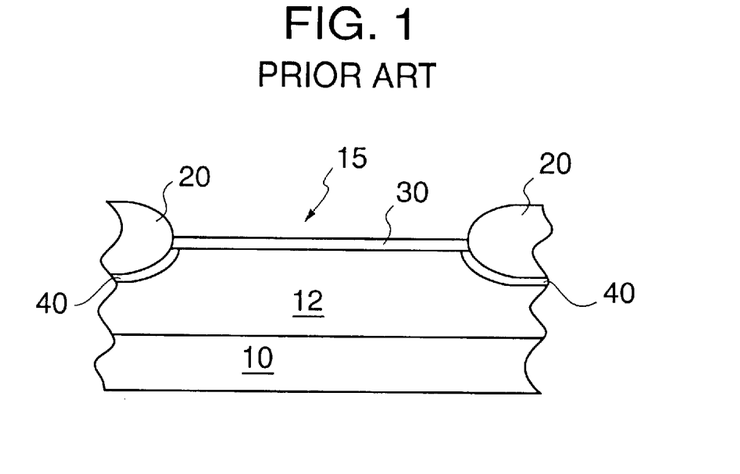
FIG. 1 is a photodiode according to the prior art.

The photodiode 15 of FIG. 1 is shown in part as a cross-sectional view of a semiconductor substrate 10 doped with a p-type material to form p-well 12. A field oxide region 20, which serves to surround and isolate the photodiode 15 may be formed by thermal oxidation of the doped substrate 10, or by chemical vapor deposition of an oxide material as in the STI (shallow trench isolation) process. More highly doped p-type regions 40 are formed under the field oxide region 20 and an n-type implant 30 is formed between the field oxide regions 20. The field oxide regions 20 may be formed before or after doped regions 30, 40. As shown in FIG. 1, p-type regions 40 and n-type implant 30 are typically doped so as to form a junction of regions 30 and 40 that is aligned or self-aligned to the edge of the field oxide 20. However, the overlapping of the p-type region 40 and the n-type region 30 results in current leakage from the photodiode to the substrate 10 through the depletion region.

The resolution of the imaging device is a function of the size and performance of each photodetector. To improve resolution, such as by presenting more image lines per inch of visual display, a greater number of photoconductors are required per unit area of the photodetector array. Imager performance is degraded if individual photodiodes have high charge leakage. It is important that the photodetector array be fabricated to allow the photodiode charge to be accurately read within the allowed data sampling time of the system.

There is needed, therefore, an improved photodiode for use in an imager apparatus that exhibits decreased charge leakage to the substrate through the depletion region. There is also need for an improved p-n junction diode for other integrated circuit applications, such as DRAM applications, which likewise exhibits reduced charge leakage to the substrate through a depletion region. A method of fabricating diodes, including photodiodes exhibiting these improvements is also needed.

SUMMARY OF THE INVENTION

The present invention provides a photodiode having improved leakage characteristics to the substrate and improved dark current characteristics. A photodiode comprises a first conductive region of the photodiode that is spaced away from the edge of a field oxide. The present invention also provides methods for forming the photodiode of the present invention.

The present invention also relates to a p-n junction diode used in other integrated circuit applications where charge leakage to the substrate through the depletion region may occur, such as where a p-n junction is formed adjacent to field oxide isolation at the memory storage node of a DRAM. In this case too the invention also provides a p-n junction with reduced leakage to substrate and method for fabricating the same by spacing the p-n junction from high leakage areas.

Additional advantages and features of the present invention will be apparent from the following detailed description and drawings which illustrate preferred embodiments of the invention.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photodiode and apparatus for converting electromagnetic radiation to an electrical signal. The following detailed description is, therefore, not to be taken in a limiting sense, and the scope of the present invention is defined by the appended claims.

Figure 2:
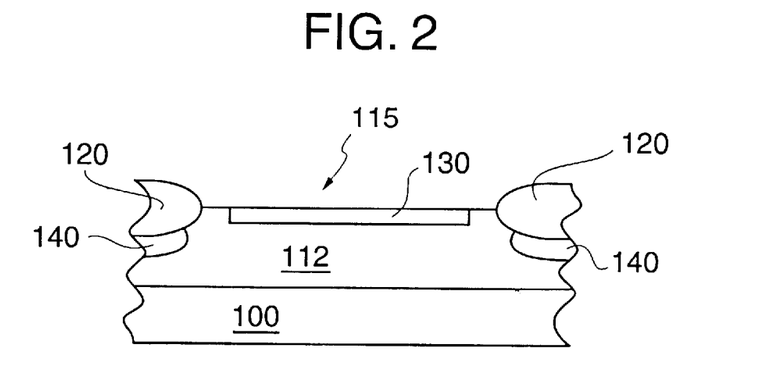
FIG. 2 is a cross-sectional view of a semiconductor wafer undergoing the process of a first embodiment of the invention.

The structure of the photodiode 115 of the first embodiment is shown in more detail in FIG. 2. The photodiode 115 may be formed in a substrate 100 doped to a first conductivity type, which for exemplary purposes is treated as a p-well 112 formed in substrate 100. A field oxide region 120 is formed around the photodiode 115 as is shown in FIG. 2. The field oxide region 120 may be formed by thermal oxidation of the doped substrate 100, or by chemical vapor deposition of an oxide material according to the STI process. While the invention is described with reference to field oxide regions 120 formed by the Local Oxidation of Silicon (LOCOS) process, it should be understood that the field oxide regions may be formed using the shallow trench isolation (STI) process.

Still with reference to FIG. 2, a first mask and resist (not shown) is applied to the substrate 100 to form an n-type region 130 in p-well 112. The mask and resist are applied to the photodiode 115 to form the n-type region 130 such that n-type region 130 is spaced away from field oxide regions 120 to reduce the electric field at the edges of the defined p-n junction. It should be understood that any suitable doping process may be used, such as ion implantation, or chemical vapor deposition. The n-type region 130 is preferably doped with arsenic, antimony or phosphorous at a dopant concentration level of from about $1 \times 10^{11}$ ions/cm$^2$ to about $1 \times 10^{16}$ ions/cm$^2$. Preferably the dopant is phosphorous which provides a less abrupt junction between the doped region and the substrate, less leakage and little damage to the underlying substrate.

The p-type regions 140 are shown in the figure as being formed under the field oxide regions 120. It should be understood that the p-type regions 140 would be formed underneath a STI or LOCOS if these forms of isolation are to be used. It should also be understood that the p-type regions 140 may be formed spaced away from the edge of the field oxide region 120, as shown, or type regions 140 may be formed such that the edge of the p-type region 140 is in contact with the edge of the field oxide region 120. Any suitable doping process known in the art may be used to form the p-type regions under the field oxide regions 120, such as, for example ion implantation. The p-type region 140 is preferably doped with boron at a dopant concentration level of from about $1 \times 10^{11}$ ions/cm$^2$ to about $1 \times 10^{14}$ ions/cm$^2$.

Figure 3:
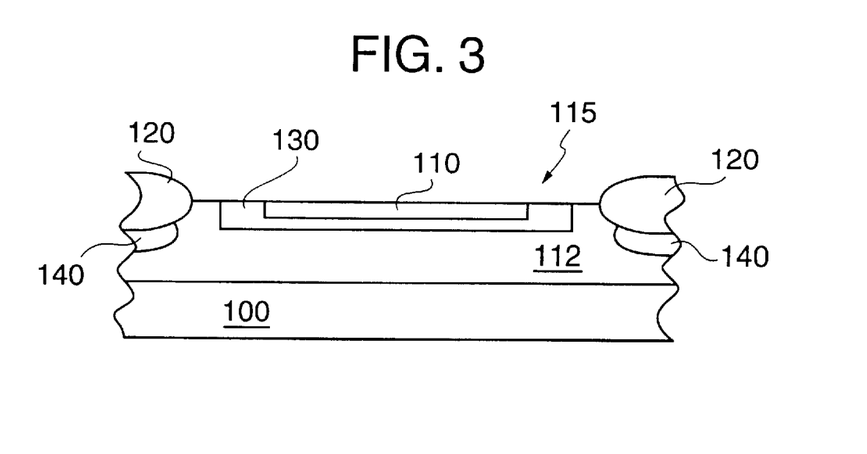
FIG. 3 illustrates the wafer at a processing step subsequent to that shown in FIG. 2.

Reference is made to FIG. 3. A second n-type region 110 is formed within the boundaries of first n-type region 130. A second resist and mask (not shown) are applied to the photodiode and the substrate is doped to form second n-type region 110. As set forth above, any suitable doping process may be used, such as ion implantation. The second n-type region 110 is doped with arsenic, antimony or phosphorous at a dopant concentration level of from about $1 \times 10^{12}$ ions/cm$^2$ to about $1 \times 10^{16}$ ions/cm$^2$. Preferably the dopant is phosphorous for the reasons set forth above. The resist and mask are removed, leaving a structure that appears as shown in FIG. 3.

It is desired that the second n-type region 110 is doped to a higher dopant concentration than the first n-type region 130 such that the charge collected in the photodiode 115 is isolated in the second n-type region 110. By isolating charge collected by the photodiode 115 in the second n-type region 110, charge leakage to the substrate is reduced. For example, if the first n-type region 130 is doped at a dopant concentration of $1 \times 10^{12}$ ions/cm$^2$ the second n-type region 110 would be doped at a doping concentration of about $1 \times 10^{13}$ ions/cm$^2$ or greater. However, it should be understood that in the present invention the specific level of doping concentration is not critical, provided that the second n-type region 110 is doped at a higher concentration than the first n-type region 130. For example, it should be understood that a first n-type region 130 that is doped n− and a second n-type region 110 doped n+, where n+ is simply defined to be a concentration greater than n− is within the scope of the present invention.

For the photodiode 115 of the first embodiment, the processing is essentially complete at this stage, and conventional processing methods may then be used to form contacts and wiring to connect the photodiode 115 to an imager apparatus. For example, the entire surface of the photodiode may then be covered with a passivation layer of, e.g., silicon dioxide or BPSG, which is CMP planarized and etched to provide contact holes, which are then metallized to provide contacts to the photodiode 115.

Figure 4:
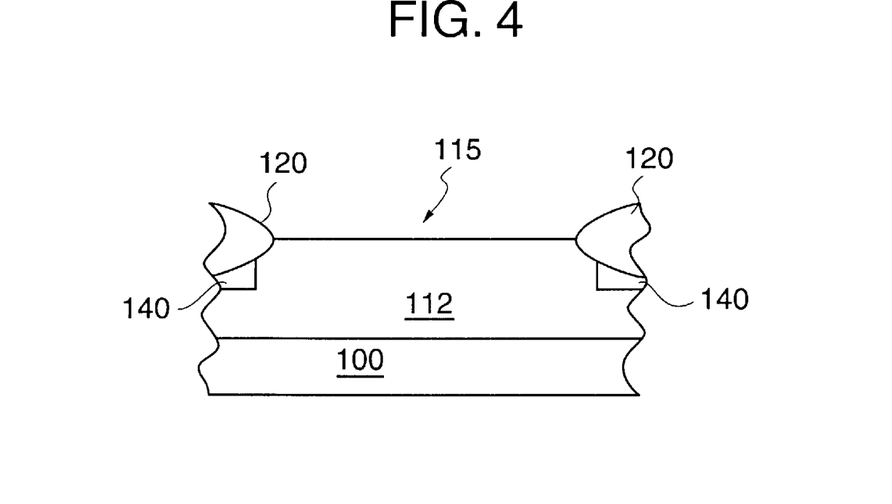
FIG. 4 is a cross-sectional view of a semiconductor wafer according to the first embodiment of the present invention undergoing a second embodiment of the process to form the photodiode of the first embodiment of the present invention.
Figure 5:
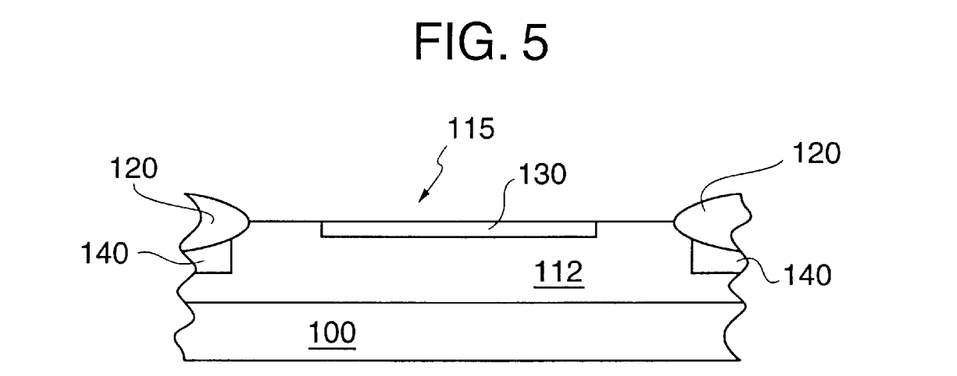
FIG. 5 illustrates the wafer at a processing step subsequent to that shown in FIG. 4.
Figure 6:
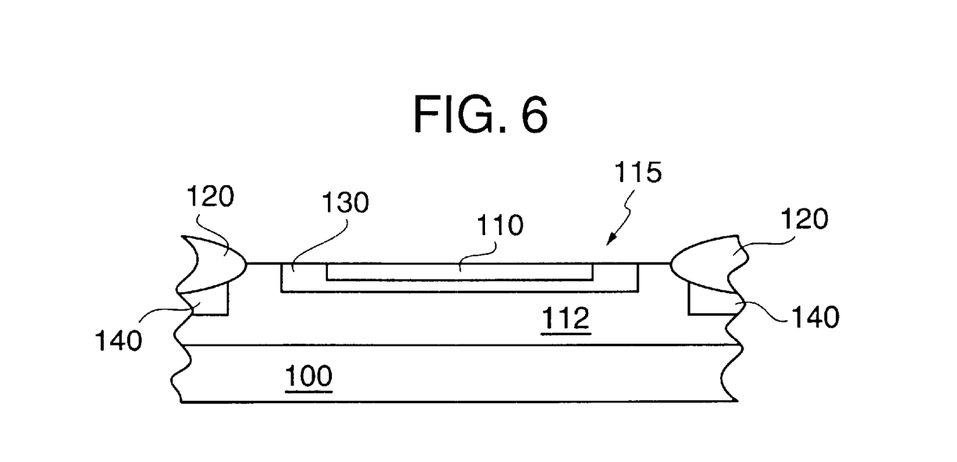
FIG. 6 illustrates the wafer at a processing step subsequent to that shown in FIG. 5.

An alternative second embodiment of the process is illustrated by FIGS. 4 through 6. As shown in FIG. 4, the process also begins with a substrate doped to a first conductivity type, which for exemplary purposes is treated as a p-type substrate. A field oxide region 120 is formed around the photodiode 115 as is shown in FIG. 2. The field oxide region 120 may be formed as described above.

A first mask and resist (not shown) is applied to the substrate 100 and the substrate 100 is doped to form p-type doped regions 140 beneath field oxide regions 120 as illustrated in FIG. 4. As noted above with respect to FIG. 2, any suitable doping process may be used, such as ion implantation. The photodiode region 115 is shown in p-well 112.

Reference is now made to FIG. 5. A second mask and resist (not shown) are applied to the photodiode 115 to form the first n– type region 130 such that n-type region 130 is spaced away from the field oxide regions 120 to facilitate reduction of the electric field across the p-n photodiode junction at the photodiode edge. Any suitable doping process may be used to form n-type region 130, such as ion implantation.

A second n-type region 110 is formed within the boundaries of the first n-type region 130. A third resist and mask (not shown) is applied to the photodiode 115 and the substrate is doped to form second n-type region 110. As set forth above, any suitable doping process may be used, such as ion implantation. Again, as was true of FIG. 3, it is important that the second n-type region 110 is doped to a higher dopant concentration than the first n-type region 130 such that the charge collected in the photodiode 115 is isolated in the second n-type region 110. The resist and mask are removed, leaving a structure as illustrated in FIG. 6.

For the photodiode 115 of the first embodiment, the processing is essentially complete at this stage, and conventional processing methods may then be used to form contacts and wiring to connect the photodiode 115 to an imager apparatus as described in more detail above with reference to FIG. 3.

Figure 7:
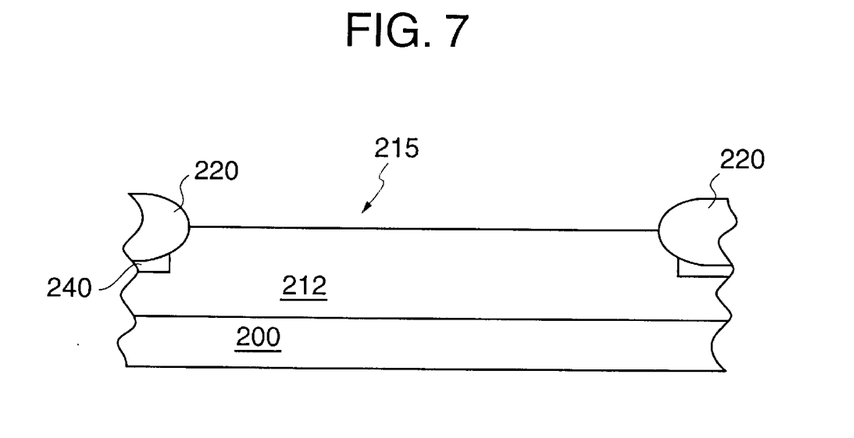
FIG. 7 is a cross-sectional view of a semiconductor wafer undergoing a first process according to a second embodiment of the invention.
Figure 8:
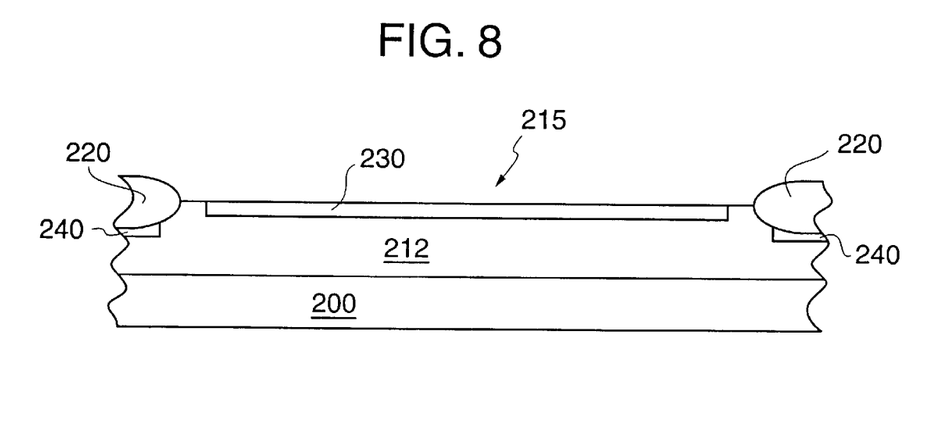
FIG. 8 illustrates the wafer at a processing step subsequent to that shown in FIG. 7.
Figure 9:
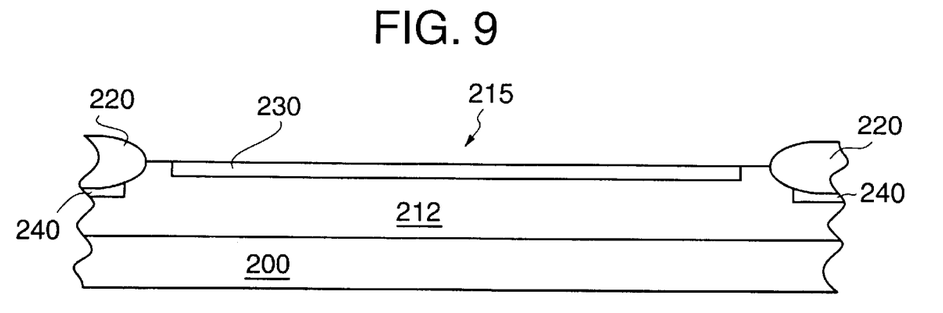
FIG. 9 is a cross-sectional view of a semiconductor wafer undergoing a second process according to a second embodiment of the invention.

A third embodiment of the present invention is illustrated by FIGS. 7–9. Reference is now made to FIG. 7. The photodiode 215 may be formed in a substrate 200 doped to a first conductivity type to form p-well 212. A field oxide region 220 is formed around the photodiode 215 as shown in FIG. 7. The field oxide region 220 may be formed by thermal oxidation of the doped substrate 200, or by chemical vapor deposition of an oxide material. While the invention is described with reference to field oxide regions 220 formed by the LOCOS process, it should be understood that the field oxide regions may be formed using the STI process.

Still with reference to FIG. 7, a first mask and resist (not shown) is applied to the substrate 200 and the substrate is doped to form p-type doped regions 240 under field oxide region 220. It should be understood that the p-type regions 240 would be formed underneath a STI or LOCOS formed isolation. It should also be understood that the p-type regions 240 may be formed spaced away from the edge of the field oxide region 220, as shown, or p-type regions 240 may be formed such that the edge of the p-type region 240 is in contact with the edge of the field oxide region 220. Any suitable doping process may be used, such as, for example, ion implantation. The p-type region 240 is preferably formed by doping the substrate 200 with boron at a dopant concentration level of from about $1 \times 10^{11}$ ions/cm$^2$ to about $1 \times 10^{14}$ ions/cm$^2$.

Reference is now made to FIG. 8. A second mask and resist (not shown) are applied to the photodiode 215 to form the n-type region 230 such that n-type region 230 is spaced away from the field oxide regions 220 to facilitate the reduction of the electric field across the p-n junction of the photodiode at the photodiode edge. Any suitable doping process may be used, such as ion implantation. The n-type region 230 may be doped with arsenic, antimony or phosphorous at a dopant concentration level of from about $1 \times 10^{11}$ ions/cm$^2$ to about $1 \times 10^{16}$ ions/cm$^2$. Preferably the dopant is phosphorous as phosphorous gives less abrupt junctions, less leakage and causes little damage to the underlying substrate.

For the photodiode 215 of the second embodiment, the processing is essentially complete at this stage, and conventional processing methods may then be used to form contacts and wiring to connect the photodiode 215 to an imager apparatus. For example, the entire surface of the photodiode may then be covered with a passivation layer of, e.g., silicon dioxide or BPSG, which is CMP planarized and etched to provide contact holes, which are then metallized to provide contacts to the photodiode 215.

A second process for preparing the photodiode of the third embodiment of the present invention is described with reference to FIG. 9. As shown in FIG. 9, this process also begins with a substrate 200 doped to a first conductivity type, which for exemplary purposes is treated as a p-well 212. A field oxide region 220 is formed around the photodiode 215. The field oxide region 220 may be formed as described above.

Still with reference to FIG. 9, a first mask and resist (not shown) is applied to the substrate 200 and the substrate is doped to form p-type doped regions 240 beneath field oxide regions 200. A second mask and resist (not shown) is used to form an n-type region 230, provided that n-type region is spaced away from the field oxide regions 220 to facilitate the reduction of the electric field across the p-n photodiode at the photodiode edge. As set forth above with respect to FIGS. 7–8, any suitable doping process may be used to dope regions 230, 240, such as, for example, ion implantation. The first and second resists and masks are then removed, leaving the structure illustrated in FIG. 9.

For the photodiode 215 of the second embodiment, the processing is essentially complete at this stage, and conventional processing methods may then be used to form contacts and wiring to connect the photodiode 215 to an imager apparatus as described in more detail above The spacing of the n-type region 130, 230 away from the field oxide region 120, 220 is dependant upon several factors. The spacing of the n-type region 130, 230 is dependant upon the dopant concentration and the bias voltage. Preferably the spacing of the n-type region 130, 230 from the field oxide region 120, 220 should be about the magnitude of one depletion region. It should be understood that the width of the depletion region will vary depending upon the generation of the process design as well as the bias voltage, the dopant concentration, thermal processing and junction depth. For example, in a 0.25 $\mu$m process using a 5V bias voltage across the photodiode, the space between the n-type region 130, 230 and the field oxide region 120, 220 is from about 0.05 $\mu$m to about 1.0 $\mu$m, preferably from about 0.1 $\mu$m to about 0.8 $\mu$m, most preferably about 0.2 to about 0.7 $\mu$m.

Figure 10:
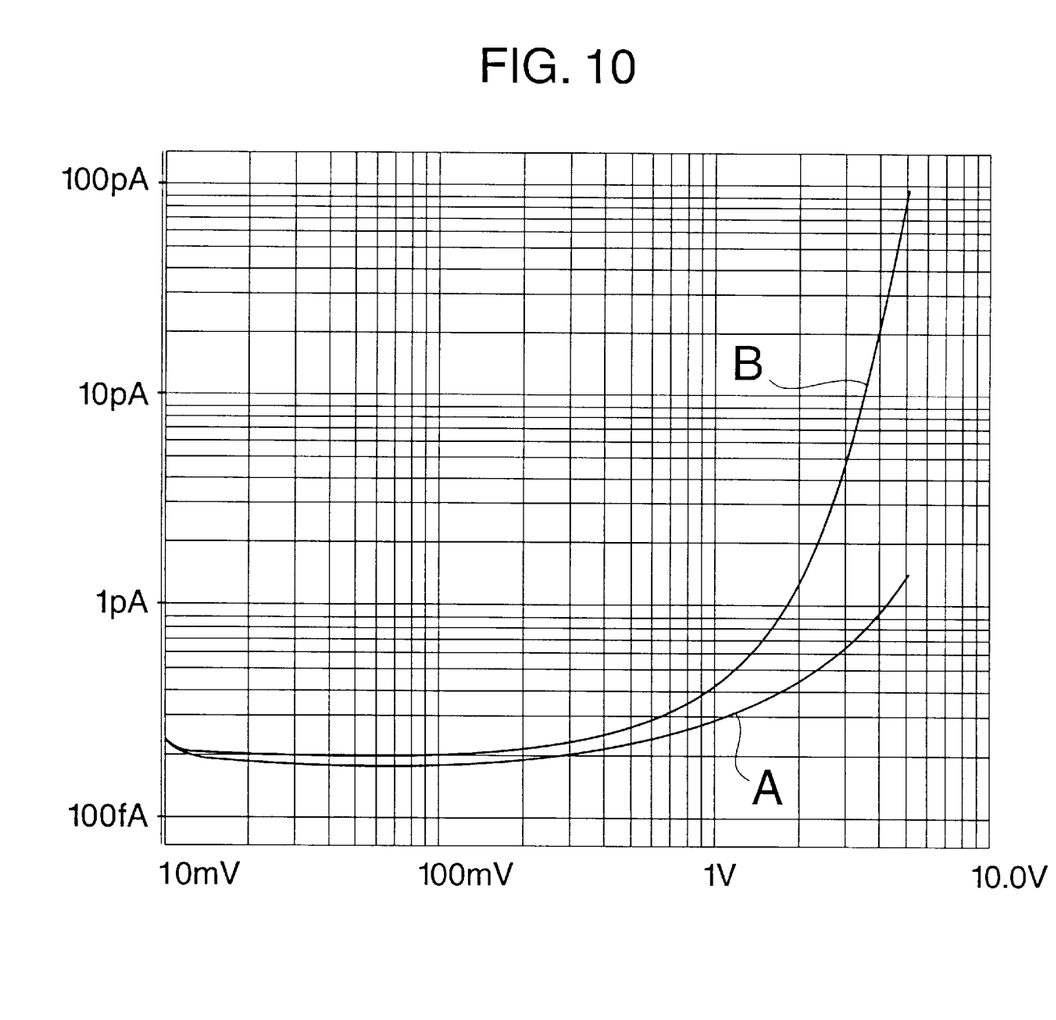
FIG. 10 illustrates a comparison of the current leakage between the photodiodes of the present invention and the photodiodes according to the prior art.
Figure 11:
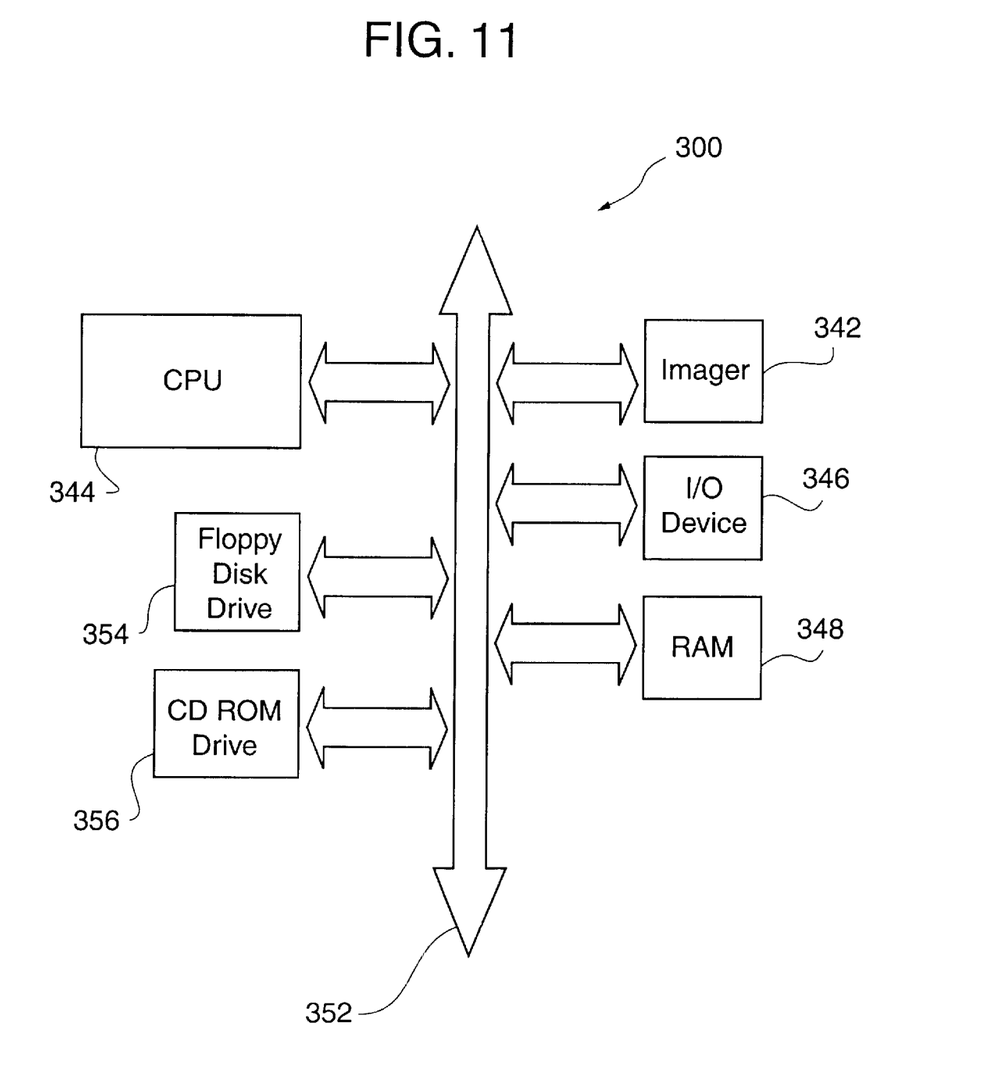
FIG. 11 illustrates a processor based system which includes a photodiode based imager device

Reference is now made to FIG. 10. The figure shows the reverse biased leakage from the photodiode versus the voltage applied to the photodiode on a log/log scale. Curve A represents a photodiode where the n-type region was set back from the field oxide region approximately 0.6 $\mu$m while curve B represents a photodiode where the n-type region and the field oxide region were self aligned as described in reference to FIG. 1 above. As can be seen from FIG. 10, as the voltage increases above 1V, the reverse biased leakage from the photodiode processed according to the prior art (curve B) increases asymptotically. In contrast, the reverse biased leakage of the photodiode fabricated according to the present invention (curve A) does not increase as rapidly as the prior art photodiode A typical processor based system which includes a photodiode based imager device according to the present invention is illustrated generally at 300 in FIG. 11. A processor based system is exemplary of a system having digital circuits which could include CMOS imager devices, CCD imager devices or the like. Without being limiting, such a system could include a computer system, camera system, scanner, machine vision system, vehicle navigation system, video telephone, surveillance system, auto focus system, star tracker system, motion detection system, image stabilization system and data compression system for high-definition television, all of which can utilize the present invention.

A processor system, such as a computer system, for example generally comprises a central processing unit (CPU) 344 that communicates with an input/output (I/O) device 346 over a bus 352. The photodiode containing imager 342 also communicates with the system over bus 352. The computer system 300 also includes random access memory (RAM) 348, and, in the case of a computer system may include peripheral devices such as a floppy disk drive 354 and a compact disk (CD) ROM drive 356 which also communicate with CPU 344 over the bus 352. Photodiode containing imager 342 is preferably constructed as an integrated circuit which includes pixels containing photodiodes optimized for low leakage, as previously described with respect to FIGS. 2 through 9. The imager 342 may be combined with a processor, such as a CPU, digital signal processor or microprocessor, in a single integrated circuit, or may reside on a separate integrated circuit.

It should be understood that various alternatives to the embodiments of the invention described herein may be employed in practicing the invention. For example, although the operation of the present invention has been described with respect to a photodiode formed by n-type implants into a p-well, the present invention applies equally well to a photodiode formed by a p-type implant into an n-well or even more complicated photodiodes such a p-n-p diodes, as well as to diodes in general which have p-n junction leakage to a substrate. Similarly, the processes described above are examples of the many processes that could be used. The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A method of forming a photodiode structure in a substrate, said method comprising the steps of:
    forming an isolation region in said substrate;
    forming a doped region of a first conductivity under said isolation region;
    forming a doped well of said first conductivity in said substrate adjacent said isolation region;
    forming a doped photoactive layer of a second conductivity in said doped well;
    wherein said doped photoactive layer is spaced apart from said doped region by an intervening region of said well; and
    forming a further doped region within said photoactive layer.

2. The method according to claim 1, wherein the first conductivity type is p-type, and the second conductivity type is n-type.

3. The method according to claim 1, wherein the semiconductor substrate is a silicon substrate.

4. The method according to claim 1, wherein the doping step comprises ion implantation.

5. The method according to claim 4, wherein said doped photoactive layer is doped with a dopant selected from the group consisting of arsenic, antimony and phosphorous.

6. The method according to claim 5, wherein said doped photoactive layer is doped at a dopant dose level of from about $1 \times 10^{11}$ ions/cm$^2$ to about $1 \times 10^{16}$ ions/cm$^2$.

7. The method according to claim 6, wherein said doped photoactive layer is spaced from said isolation regions by applying a mask to said substrate.

8. A method of forming a photodiode in a substrate, said method comprising the steps of:
    forming an isolation region in said substrate;
    forming a doped region of a first conductivity under said isolation region;
    forming a doped well of said first conductivity in said substrate adjacent said isolation region;
    forming a first doped photoactive layer of a second conductivity in said doped well such that said first doped photoactive layer is spaced apart from said isolation region and doped region by a portion of said doped well; and
    forming a second doped photoactive layer of a second conductivity within said first doped photoactive layer, such that said second doped photoactive layer has a dopant dose that is greater than that of said first doped photoactive layer.

9. The method according to claim 8, wherein the first conductivity type is p-type, and the second conductivity type is n-type.

10. The method according to claim 8, wherein the semiconductor substrate is a silicon substrate.

11. The method according to claim 8, wherein the doping step comprises ion implantation.

12. The method according to claim 11, wherein said first doped photoactive layer is doped with a dopant selected from the group consisting of arsenic, antimony and phosphorous.

13. The method according to claim 12, wherein said first doped photoactive layer is doped at a dopant dose level of from about $1 \times 10^{11}$ ions/cm$^2$ to about $1 \times 10^{16}$ ions/cm$^2$.

14. The method according to claim 13, wherein said second doped photoactive layer is doped with a dopant selected from the group consisting of arsenic, antimony and phosphorous.

15. The method according to claim 14, wherein said second doped photoactive layer is doped at a dopant dose level of from about $1 \times 10^{11}$ ions/cm$^2$ to about $1 \times 10^{16}$ ions/cm$^2$.

16. The method according to claim 13, wherein said first doped photoactive layer is spaced from said isolation regions by applying a mask to said substrate.

* * * * *

UNITED STATES PATENT AND TRADEMARK OFFICE
CERTIFICATE OF CORRECTION

PATENT NO. : 6,534,335 B1 Page 1 of 1
DATED : March 18, 2003
INVENTOR(S) : Howard E. Rhodes et al.

It is certified that error appears in the above-identified patent and that said Letters Patent is hereby corrected as shown below:

<u>Column 4,</u>
Line 7, change "or type" to -- or p-type --.

Signed and Sealed this

Fifth Day of August, 2003

JAMES E. ROGAN
*Director of the United States Patent and Trademark Office*